(12) United States Patent
Wang

(10) Patent No.: US 7,165,602 B2
(45) Date of Patent: Jan. 23, 2007

(54) HEAT SINK STRUCTURE

(75) Inventor: Chia Hua Wang, Taipei City (TW)

(73) Assignee: Hipro Electronic Co., Ltd. (TW)

( * ) Notice: Subject to any disclaimer, the term of this patent is extended or adjusted under 35 U.S.C. 154(b) by 0 days.

(21) Appl. No.: 10/932,094

(22) Filed: Sep. 2, 2004

(65) Prior Publication Data

US 2005/0061475 A1 Mar. 24, 2005

(30) Foreign Application Priority Data

Sep. 18, 2003 (TW) .............................. 92216760 U

(51) Int. Cl.
*H05K 7/20* (2006.01)
(52) U.S. Cl. ..................... 165/80.2; 361/704; 165/135
(58) Field of Classification Search ............... 165/80.3, 165/104.33, 104.34, 185; 361/697, 704
See application file for complete search history.

(56) References Cited

U.S. PATENT DOCUMENTS

| | | | | |
|---|---|---|---|---|
| 2,544,183 A | * | 3/1951 | Rogers et al. | 165/104.34 |
| 4,871,015 A | * | 10/1989 | Foley et al. | 165/76 |
| 5,274,193 A | * | 12/1993 | Bailey et al. | 174/16.3 |
| 5,323,295 A | * | 6/1994 | Pines | 361/709 |
| 5,469,708 A | * | 11/1995 | Harrison et al. | 62/3.64 |
| 5,894,407 A | * | 4/1999 | Aakalu et al. | 361/695 |
| 5,930,116 A | * | 7/1999 | Palmer | 361/704 |
| 6,062,300 A | * | 5/2000 | Wang et al. | 165/80.2 |
| 6,140,614 A | * | 10/2000 | Padamsee | 219/438 |
| 6,259,798 B1 | * | 7/2001 | Perkins et al. | 381/397 |
| 6,374,912 B1 | * | 4/2002 | LaGrotta et al. | 165/185 |
| 6,504,720 B2 | * | 1/2003 | Furuya | 361/699 |
| 6,586,674 B2 | * | 7/2003 | Krause et al. | 174/50.5 |
| 6,940,712 B2 | * | 9/2005 | Chu et al. | 361/679 |
| 2001/0022219 A1 | * | 9/2001 | Ikeda et al. | 165/46 |
| 2002/0029868 A1 | * | 3/2002 | Katsui | 165/80.3 |
| 2004/0109322 A1 | * | 6/2004 | Desanto et al. | 362/372 |
| 2005/0011199 A1 | * | 1/2005 | Grisham et al. | 62/3.7 |

* cited by examiner

*Primary Examiner*—Allen J. Flanigan
(74) *Attorney, Agent, or Firm*—Bacon & Thomas PLLC

(57) ABSTRACT

The present invention provides a heat sink structure, which includes: a housing located on a material with low thermal conductivity; and a heat conductor placed inside the housing. At least one air gap is formed between the heat conductor and the housing to reduce the conductivity from the heat conductor to the housing, and thus increasing the thermal resistance between the heat conductor and the housing. The surface temperature of the bottom of the housing thus could be reduced and averaged, so as to effectively improve the lifespan, the safety and reliability of a device with the heat sink structure.

4 Claims, 6 Drawing Sheets

HEAT SINK STRUCTURE

BACKGROUND OF THE INVENTION

1. Field of the Invention

The present invention relates to a heat sink structure, and particularly to a heat sink structure formed with an air gap between a heat conductor composed of different material and a housing of an electronic device.

2. Description of the Related Art

The conventional heat dissipation method for one heat-generating component inside an electronic device was to combine a fin with the heat-generating component to lower the temperature of the heat-generating component. When the electronic device is located on a material with low thermal conductivity, since the central portion at the bottom of the electronic device could not dissipate the heat, the central portion of the bottom of the electronic device will have higher surface temperature than other portions.

In order to resolve the above-mentioned drawback, Taiwan Patent Publication No. 447693 disclosed an uniform heat dissipation device, which includes a first heat conductor having a first portion for absorbing thermal energy from the heat-generating component and a second portion not being contacted with the heat-generating component; and a second heat conductor having a first portion with relatively lower thermal conductivity to contact with the first portion of the first heat conductor and having a second portion with relatively higher thermal conductivity to contact with the second portion of the first heat conductor, so as to transfer the thermal energy from the first heat conductor to the housing.

In Taiwan Patent Publication No. 447693, the heat-generating component firstly contacts with the first portion of the first heat conductor with high conductivity, and the first portion of the first heat conductor is again contacted with the first portion of the second heat conductor with low thermal conductivity for transferring the thermal energy from the first heat conductor to the housing. The design of the structure of the uniform heat dissipation device relies on the position of the heat-generating component. For different electronic devices, the positions of the heat-generating component are different, and the position of the first portion with low thermal conductivity of the second heat conductor needs to be changed according to the position of the heat-generating component. This will cause the inconvenience for manufacturing and the increasing cost for designing different heat conductors for different electronic devices. This situation needs to be improved.

SUMMARY OF THE INVENTION

The objective of the present invention is to provide a heat sink structure, which employs an air gap formed between a heat conductor and a housing to increase the thermal resistance from heat-generating components inside an electronic device to the housing thereof, and making an uniform surface temperature on the bottom of the housing of the electronic device located on a material with low thermal conductivity.

The heat sink structure for achieving this objective includes: a housing located on a material with low thermal conductivity; and a heat conductor placed inside the housing and at least an air gap formed between the heat conductor and the housing.

The housing is located on a material with low thermal conductivity.

The material with low thermal conductivity may be the material such as wood, carpet or material for clothing.

The heat conductor may be configured with a hollow flange associated with a flat bottom, so as to form an air gap between the heat conductor and the housing.

The heat conductor may be configured with a housing having an integrated shoulder, so as to form an air gap between the heat conductor and the housing.

The heat conductor may be configured with a housing with an integrated flange, so as to form an air gap between the heat conductor and the housing.

The material for the heat conductor may be the material with good thermal conductivity, such as Copper or Aluminum.

The air gap may be substituted with a material with low thermal conductivity, such as foam, vesicant material.

The material for the flange of the housing may be the material of plastic or metal.

DETAILED DESCRIPTION OF THE INVENTION

Figure 1:
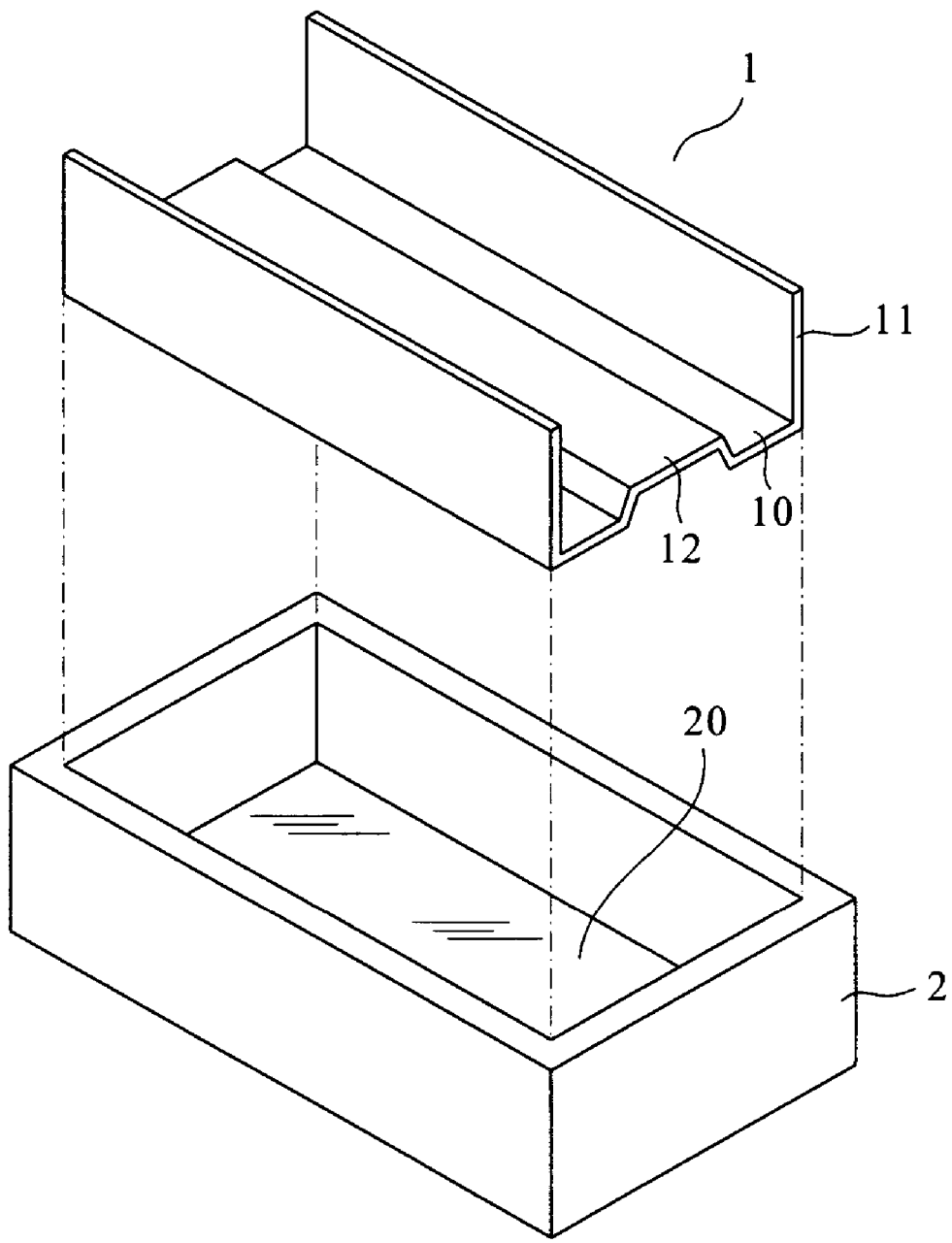
FIG. 1 is an exploded view of the heat sink structure according to one preferred embodiment of the present invention.

Referring to FIG. 1, the figure shows an exploded view of the heat sink structure 100 according to a preferred embodiment of the present invention. The heat sink structure 100 includes: a housing 2 with a bottom 20; a heat conductor 1 with a bottom 10 and a vertical portion 11 vertically and upwardly extended from the bottom 10, and the central portion of the bottom 10 is configured with a flange 12.

Figure 2:
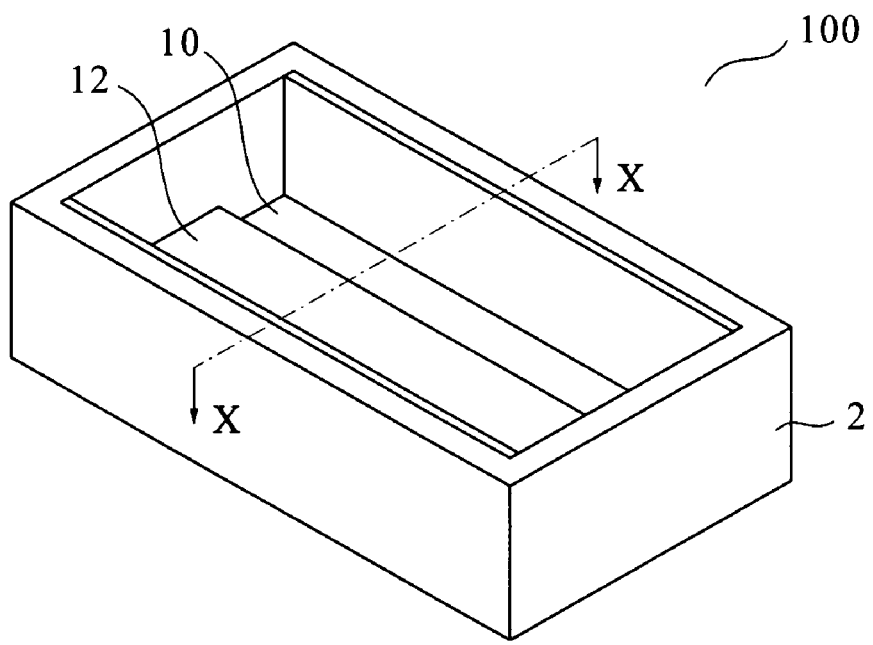
FIG. 2 is a perspective assembled view of the heat sink structure of FIG. 1.
Figure 3:
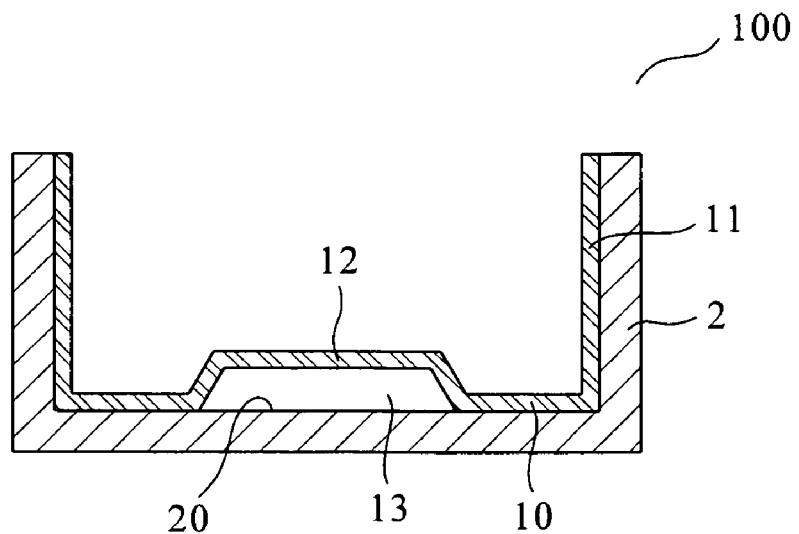
FIG. 3 is a cross-sectional view along line X—X in FIG. 1.

Continually referring to FIG. 1 accompanying with FIG. 2 that shows a perspective assembled view of the heat sink structure 100, wherein the bottom 20 of the housing 2 is a flat bottom, and the housing 2 is located on a material with low thermal conductivity. The material with low thermal conductivity can be the material of wood, carpet or material for clothing. The heat conductor 1 is placed inside the housing 2, and by overlapping the flange 12 of the heat conductor 1 on the bottom 20 of the housing 2 to form an air gap 13 (referring to FIG. 3). The material for the heat conductor 1 can be the material with good thermal conductivity, such as Copper or Aluminum. The top of the heat conductor 1 is further placed with a heat-generating component (not shown in the figure), wherein the thermal energy generated from the heat-generating-component is uniformly absorbed by the heat conductor 1, and with the air gap 13 formed between the heat conductor 1 and the housing 2 to reduce the conductivity therebetween, and thus reducing the surface temperature of the central portion of the bottom 20 of the housing 2, thus forming the heat sink structure 100 of the present invention.

Figure 4:
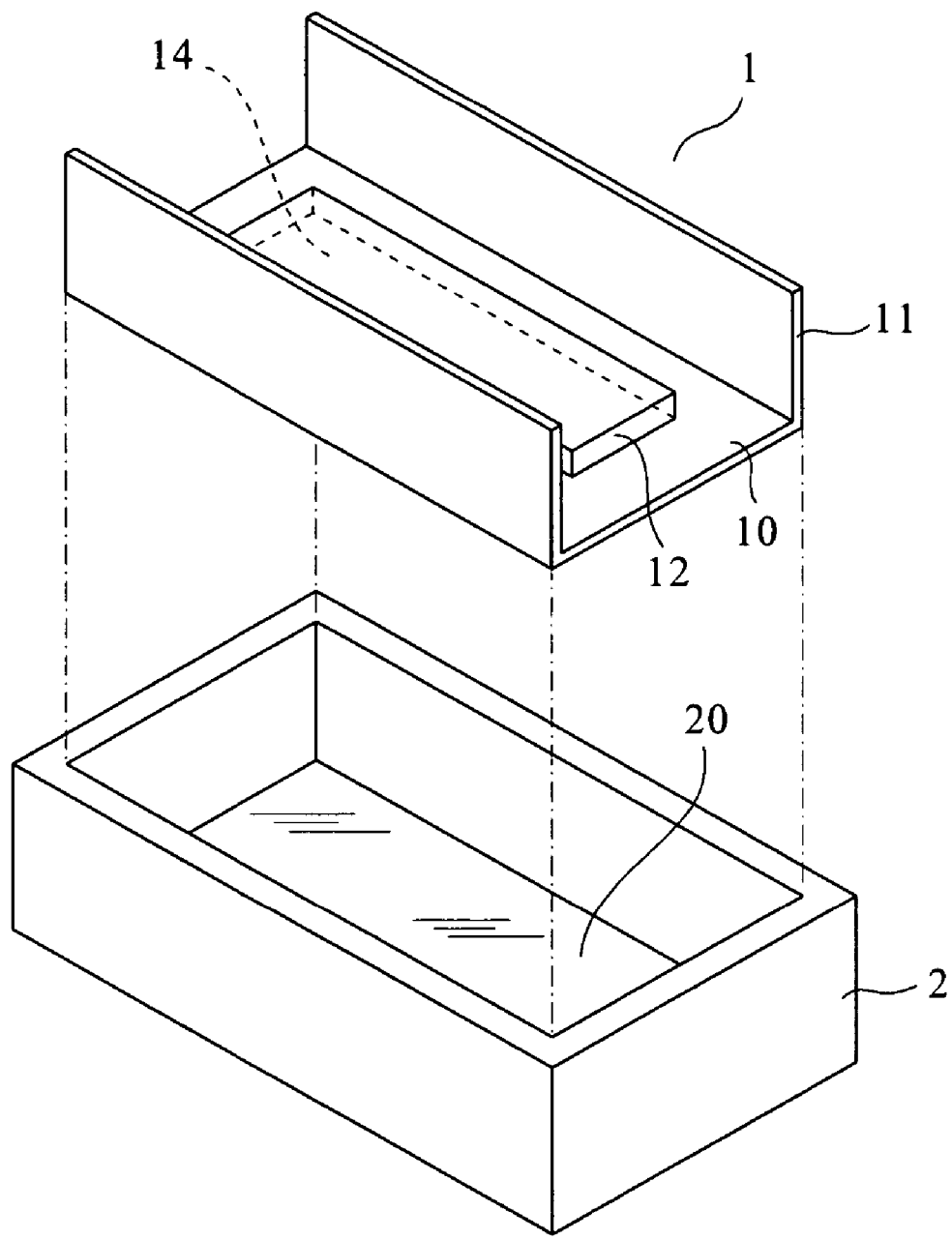
FIG. 4 is an exploded view of the heat sink structure with a variance of the heat conductor of FIG. 1.

Referring to FIG. 4, the figure shows an exploded view of the heat sink structure 100 with a variance of the heat conductor 1. The heat sink structure 100 includes: a housing 2 with a bottom 20; and a heat conductor 1 with a bottom 10 and a vertical portion 11 vertically and upwardly extended from the bottom 10, and the bottom 10 is integrally configured with a hollow flange 12 to form a groove 14 on the bottom 10. The groove 14 is overlapped with the bottom 20 of the housing 2 to form an air gap 13 (referring to FIG. 3) to increase the thermal resistance from the heat conductor 1 to the housing 2, thus reducing the surface temperature of the central portion of the bottom 20 of the housing 2, so as to form the heat sink structure 100 of the present invention.

Figure 5:
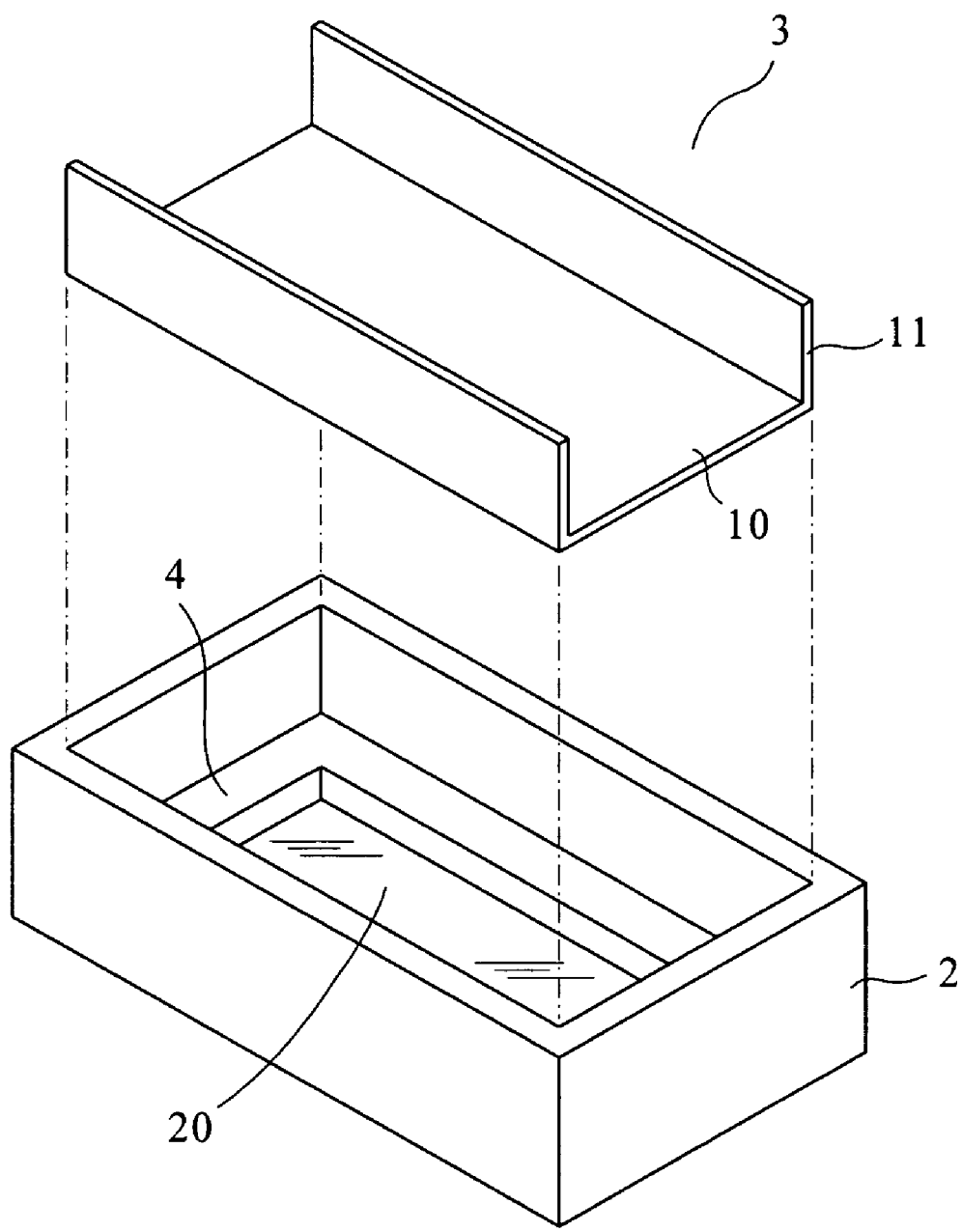
FIG. 5 is an exploded view of the heat sink structure according to one another embodiment of the present invention.

Referring to FIG. 5, the figure shows an exploded view of the heat sink structure 100 according to one another embodiment of the present invention. The heat sink structure 100 includes: a housing 2 with a bottom 20; a first heat conductor 3 with a bottom 10 and a vertical portion 11 vertically and upwardly extended from the bottom 10; and a second heat conductor 4 with a hollow body. The second heat conductor 4 is configured on the periphery of the bottom 20 of the housing 2.

Figure 6:
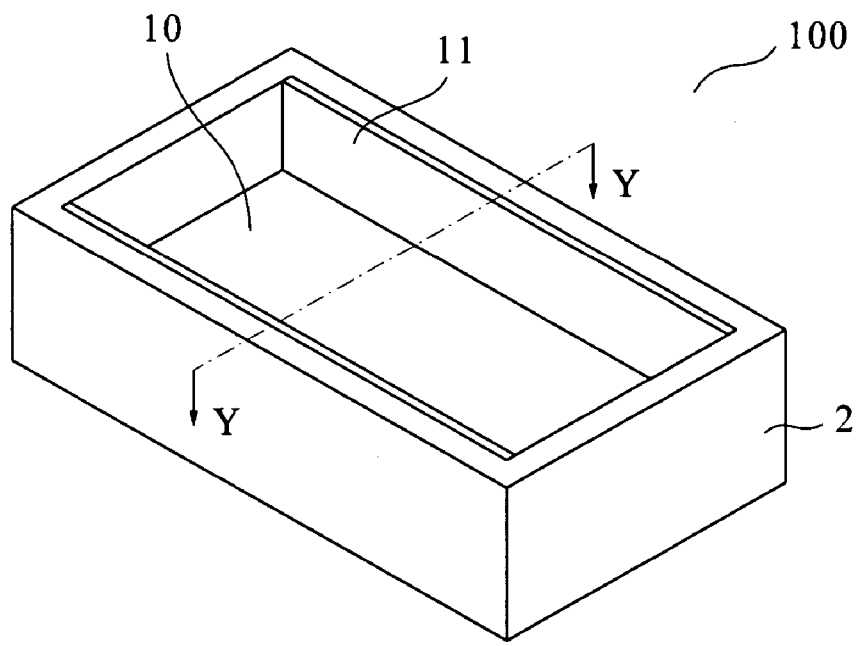
FIG. 6 is a perspective assembled view of the heat sink structure of FIG. 5.

Continually referring to FIG. 5 accompanied with FIG. 6 showing a perspective assembled view of the heat sink structure 100 of FIG. 5, wherein the housing 2 is located on a material with low thermal conductivity. The material with low thermal conductivity can be wood, carpet or material for clothing, and the like. The first heat conductor 3 is overlapped on the second heat conductor 4, and the bottom 10 of the first heat conductor 3 is a flat bottom, and by overlapping the flat bottom 10 of the first heat conductor 3 on the second heat conductor 4 to form an air gap 13 (referring to FIG. 7). The material of the bottom 20 of the housing 2 may be the material of plastic or metal, and the material for the first heat conductor 3 and the second heat conductor 4 may be the material with good thermal conductivity, such as Copper or Aluminum. The top of the first heat conductor 3 is further placed with a heat-generating component (not shown in the figure), wherein the thermal energy generated from the heat-generating component is uniformly absorbed by the first heat conductor 3, and with the air gap 13 formed between the first heat conductor 3 and the second heat conductor 4 to reduce the conductivity from the first heat conductor 3 to the housing 2, and reducing the surface temperature of the central portion of the bottom 20 of the housing 2, thus forming the heat sink structure 100 of the present invention.

Figure 7:
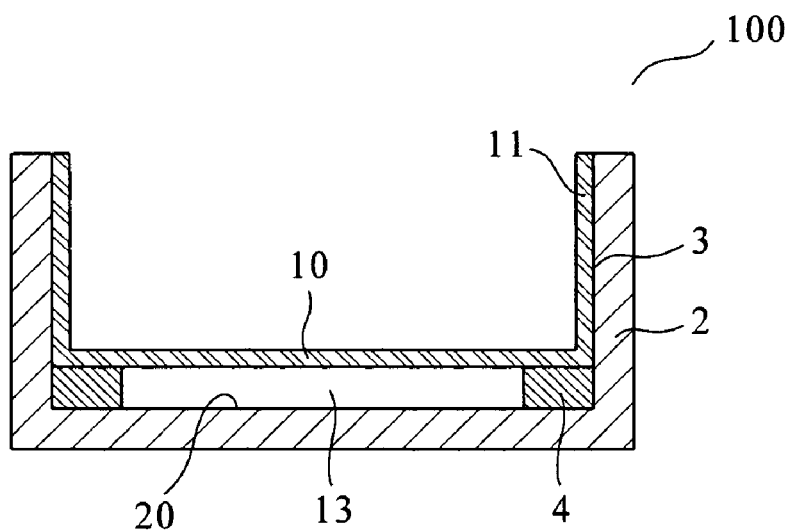
FIG. 7 is a cross-sectional view along line Y—Y in FIG. 5.

Referring to FIG. 7, the figure shows a cross-sectional view along line Y—Y in FIG. 6, wherein when the first heat conductor 3 absorbs the thermal energy generated from the heat-generating component, since the first heat conductor 3 is made of the material with good thermal conductivity, it can uniformly absorb the thermal energy generated by the heat-generating component, and with the air gap 13 formed between the flat bottom 10 of the first heat conductor 3 and the second heat conductor 4 to increase the thermal resistance from the first heat conductor 3 to the housing 2, thus reducing the surface temperature of the central portion of the bottom 20 of the housing 2.

Figure 8:
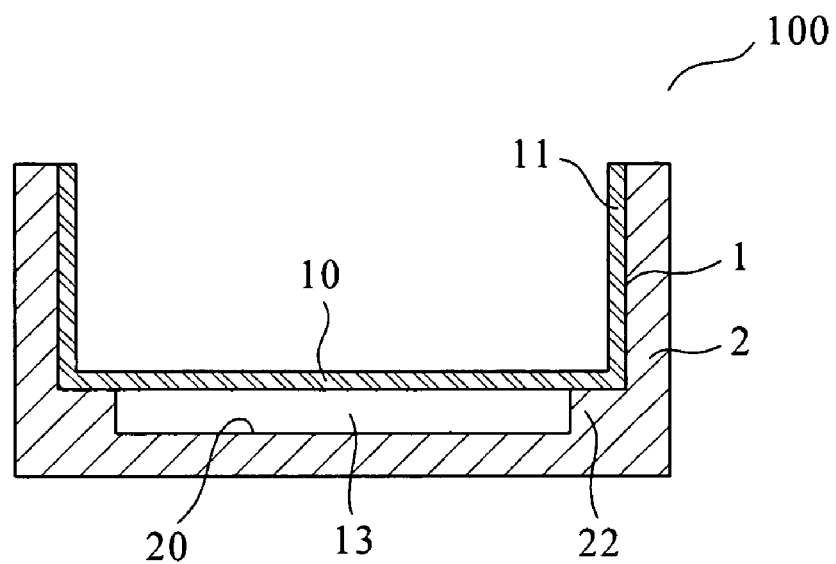
FIG. 8 is a cross-sectional view of the heat sink structure according to a further embodiment of the present invention.

Referring to FIG. 8, the figure shows a cross-sectional view of the heat sink structure 100 according to a further embodiment of the present invention. The heat sink structure 100 according to this embodiment includes: a housing 2 integrally configured with a shoulder 22 at the bottom edge; and a heat conductor 1 with a bottom 10 and a vertical portion 11 vertically and upwardly extended from the bottom 10, wherein an air gap 13 is formed between the shoulder 22 and the bottom 10 of the heat conductor 1, so as to increase the thermal resistance from the heat conductor 1 to the housing 2, and to reduce the surface temperature of the central portion of the bottom 20 of the housing 2.

Figure 9:
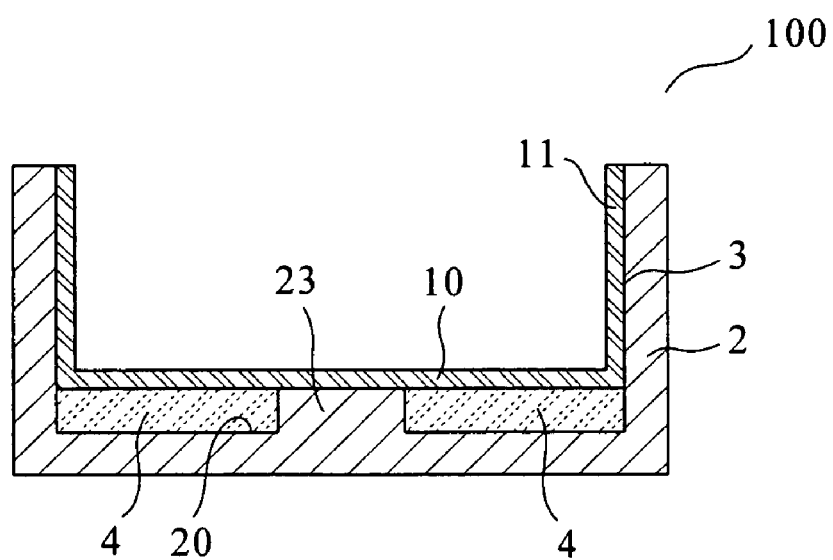
FIG. 9 is a cross-sectional view of the heat sink structure according to still a further embodiment of the present invention.

Referring to FIG. 9, the figure shows a cross-sectional view of the heat sink structure 100 according to still a further embodiment of the present invention. The heat sink structure 100 includes: a housing 2 integrally configured with a flange 23 on the central position of the bottom 20 thereof; a first heat conductor 3 with a bottom 10 and a vertical portion 11 vertically and upwardly extended from the bottom 10; and a second heat conductor 4 made of the material with higher thermal conductivity, and configured on both sides of the flange 23. The housing 2 is made of the material with lower thermal conductivity. The heat sink structure 100 has higher thermal resistance from the central portion to the bottom 20 of the housing 2 than that of the periphery portion, so as to reduce the surface temperature of the central portion of the bottom 20 of the housing 2.

After the detailed description of the preferred embodiments according to the present invention, the skilled person in the art can clearly understand that there are various alternatives and changes without departing from the spirit and scope of the following claims, and the present invention is not limited to the implementation of the embodiments in the application document. For example, the present invention can replace the air gap formed between the heat conductor and the housing with the material with low thermal conductivity, such as foam, vesicant material and the like.

What is claimed is:

1. A heat sink structure, including:

a housing; and a heat conductor enclosed and surrounded by said housing, said heat conductor being configured with a flange on a bottom thereof and a pair of vertical portions upwardly extending respectively from two opposite sides of the bottom of said heat conductor such that said vertical portions of said heat conductor are abutted against portions of said housing;

wherein by overlapping said flange of said heat conductor on said housing at least one air gap is formed therebetween.

2. The heat sink structure of claim 1, wherein the material of said heat conductor is material with good thermal conductivity.

3. The heat sink structure of claim 2, wherein the material of said heat conductor is Aluminum or Copper.

4. The heat sink structure of claim 1, wherein the air gap is filled with a material with low thermal conductivity, selected from foam and vesicant material.

* * * * *